(12) United States Patent
Thompson et al.

(10) Patent No.: US 9,452,920 B2
(45) Date of Patent: *Sep. 27, 2016

(54) MICROELECTROMECHANICAL SYSTEM DEVICE WITH INTERNAL DIRECT ELECTRIC COUPLING

(71) Applicant: InvenSense, Inc., San Jose, CA (US)

(72) Inventors: Matthew Julian Thompson, Beaverton, OR (US); Joseph Seeger, Menlo Park, CA (US)

(73) Assignee: INVENSENSE, INC., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/979,194

(22) Filed: Dec. 22, 2015

(65) Prior Publication Data
US 2016/0107881 A1 Apr. 21, 2016

Related U.S. Application Data

(60) Continuation-in-part of application No. 14/590,839, filed on Jan. 6, 2015, now Pat. No. 9,221,676, which (Continued)

(51) Int. Cl.
*B81B 7/00* (2006.01)
*B81C 1/00* (2006.01)

(52) U.S. Cl.
CPC ......... *B81B 7/0006* (2013.01); *B81B 7/0064* (2013.01); *B81C 1/00269* (2013.01); *B81C 1/00301* (2013.01); *B81B 2201/0264* (2013.01); *B81B 2207/098* (2013.01); *B81C 2201/013* (2013.01); *B81C 2203/019* (2013.01);

(Continued)

(58) Field of Classification Search
CPC .................................................. B81B 7/0006
See application file for complete search history.

(56) References Cited

U.S. PATENT DOCUMENTS

| 6,936,918 B2 * | 8/2005 | Harney | B81B 7/007 257/704 |
| 7,964,428 B2 * | 6/2011 | Breng | B81C 1/00333 438/51 |

(Continued)

*Primary Examiner* — Lex Malsawma
(74) *Attorney, Agent, or Firm* — Amin, Turocy & Watson, LLP (57) ABSTRACT

A method of fabricating electrical connections in an integrated MEMS device is disclosed. The method comprises providing a MEMS substrate which includes forming one or more cavities in a first semiconductor layer; forming a second semiconductor layer; and providing a dielectric layer between the first semiconductor layer and the second semiconductor layer The MEMS substrate providing step further includes bonding the first semiconductor layer to a second semiconductor layer; etching at least one via through the second semiconductor layer and the dielectric layer; and depositing a first conductive material onto the second semiconductor layer surface and filling the at least one via. The MEMS substrate providing step also includes depositing a second conductive material on top of the first conductive material; etching the second conductive material and the first conductive material to form at least one stand-off; the second semiconductor layer to define one or more MEMS structures; and the first semiconductor layer to create an opening to separate the first semiconductor layer into a first portion and a second portion. The method further comprises bonding the MEMS substrate to a base substrate using a eutectic bond between the second conductive material and metal pads of the base substrate.

14 Claims, 9 Drawing Sheets

Related U.S. Application Data is a continuation of application No. 14/456,973, filed on Aug. 11, 2014, now Pat. No. 8,945,969, which is a continuation of application No. 14/033,366, filed on Sep. 20, 2013, now Pat. No. 8,822,252, which is a division of application No. 13/754,462, filed on Jan. 30, 2013, now Pat. No. 8,564,076.

(52) U.S. Cl.
CPC .. *B81C2203/0118* (2013.01); *B81C 2203/031* (2013.01); *B81C 2203/035* (2013.01)

(56) References Cited

U.S. PATENT DOCUMENTS

| | | | | |
|---|---|---|---|---|
| 7,982,291 B2 * | 7/2011 | Kuisma | ................ | B81C 1/0023 257/676 |
| 8,564,076 B1 * | 10/2013 | Huang | ................... | B81B 7/0064 257/414 |
| 2002/0079550 A1 * | 6/2002 | Daneman | .............. | B81B 3/0008 257/459 |
| 2008/0079120 A1 * | 4/2008 | Foster | .................... | B81B 7/007 257/619 |
| 2011/0155548 A1 * | 6/2011 | Foster | ................ | B81C 1/00333 200/181 |
| 2012/0086126 A1 * | 4/2012 | Shu | .................... | B81C 1/00238 257/773 |
| 2012/0086127 A1 * | 4/2012 | Shu | .................... | B81C 1/00238 257/773 |
| 2013/0043510 A1 * | 2/2013 | Shu | .................... | B81C 1/00269 257/254 |

* cited by examiner

FIG.8A Thinned Act on Bonding side

FIG.8B Thinned ACT on Non-Bonding side

FIG.8C Thinned Handle on bonding side

FIG.8D Thinned Handle on Non-Bonding side

MICROELECTROMECHANICAL SYSTEM DEVICE WITH INTERNAL DIRECT ELECTRIC COUPLING

CROSS-REFERENCE TO RELATED APPLICATION

This application is a continuation-in-part of U.S. patent application Ser. No. 14/590,839, filed Jan. 6, 2015, entitled "INTERNAL ELECTRICAL CONTACT FOR ENCLOSED MEMS DEVICES," which is a Continuation Application and claims priority to U.S. application Ser. No. 14/456,973, filed Aug. 11, 2014, entitled "INTERNAL ELECTRICAL CONTACT FOR ENCLOSED MEMS DEVICES," which is a Continuation Application and claims priority to U.S. application Ser. No. 14/033,366, filed Sep. 20, 2013, entitled "INTERNAL ELECTRICAL CONTACT FOR ENCLOSED MEMS DEVICES," which is a Divisional Application and claims priority to U.S. patent application Ser. No. 13/754,462, filed on Jan. 30, 2013, entitled "INTERNAL ELECTRICAL CONTACT FOR ENCLOSED MEMS DEVICES," all of which are incorporated herein by reference.

FIELD OF THE INVENTION

The present invention relates generally to MEMS devices and more specifically to providing electric contact of the enclosure of the MEMS devices.

BACKGROUND

MEMS devices are utilized in a variety of environments. In such devices a handle layer is normally required to be electrically grounded to provide an electric shield for low noise performance. The electrical connection to the handle layer is provided by a wire bond. However, the wire bond requires vertical space and increases overall thickness of the MEMS device when packaged. Accordingly, what is desired is a MEMS device and method where the wire bond is not necessary.

The MEMS device and method for providing electrical connection to the handle layer should be simple, easily implemented and adaptable to existing environments. The present invention addresses such a need.

SUMMARY OF THE INVENTION

A method of fabricating electrical connections in an integrated MEMS device is disclosed. The method comprises providing a MEMS substrate which includes forming one or more cavities in a first semiconductor layer; forming a second semiconductor layer; and providing a dielectric layer between the first semiconductor layer and the second semiconductor layer The MEMS substrate providing step further includes bonding the first semiconductor layer to a second semiconductor layer; etching at least one via through the second semiconductor layer and the dielectric layer; and depositing a first conductive material onto the second semiconductor layer surface and filling the at least one via.

The MEMS substrate providing step also includes depositing a second conductive material on top of the first conductive material; etching the second conductive material and the first conductive material to form at least one stand-off; the second semiconductor layer to define one or more MEMS structures; and the first semiconductor layer to create an opening to separate the first semiconductor layer into a first portion and a second portion. The method further comprises bonding the MEMS substrate to a base substrate using a eutectic bond between the second conductive material and metal pads of the base substrate.

Accordingly, a MEMS process in accordance with an embodiment provides an internal electrical connection and eliminates the need for an external wire bond for grounding needed in conventional MEMS devices and may reduce the device thickness. Other aspects and advantages of the present invention will become apparent from the following detailed description, taken in conjunction with the accompanying drawings, illustrating by way of example the principles of the invention.

DETAILED DESCRIPTION OF PREFERRED EMBODIMENTS

The present invention relates generally to MEMS devices and more specifically to electric coupling for enclosed CMOS-MEMS devices. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

In the described embodiments Micro-Electro-Mechanical Systems (MEMS) refers to a class of structures or devices fabricated using semiconductor-like processes and exhibiting mechanical characteristics such as the ability to move or deform. MEMS often, but not always, interact with electrical signals. MEMS devices include but are not limited to gyroscopes, accelerometers, magnetometers, pressure sensors, and radio-frequency components. Silicon wafers containing MEMS structures are referred to as MEMS wafers.

In the described embodiments, MEMS device may refer to a semiconductor device implemented as a micro-electromechanical system. MEMS structure may refer to any feature that may be part of a larger MEMS device. An engineered silicon-on-insulator (ESOI) wafer may refer to a SOI wafer with cavities beneath the silicon device layer or substrate. Handle wafer typically refers to a thicker substrate used as a carrier for the thinner silicon device substrate in a silicon-on-insulator wafer. Handle substrate and handle wafer can be interchanged.

In the described embodiments, a cavity may refer to an opening or recession in a substrate wafer and enclosure may refer to a fully enclosed space.

To describe the features of the invention in more detail, apparatus and fabrication methods to achieve a direct electric coupling of handle layer, device layer and base substrate of a MEMS device without a metal wire-bond are disclosed.

Figure 1:
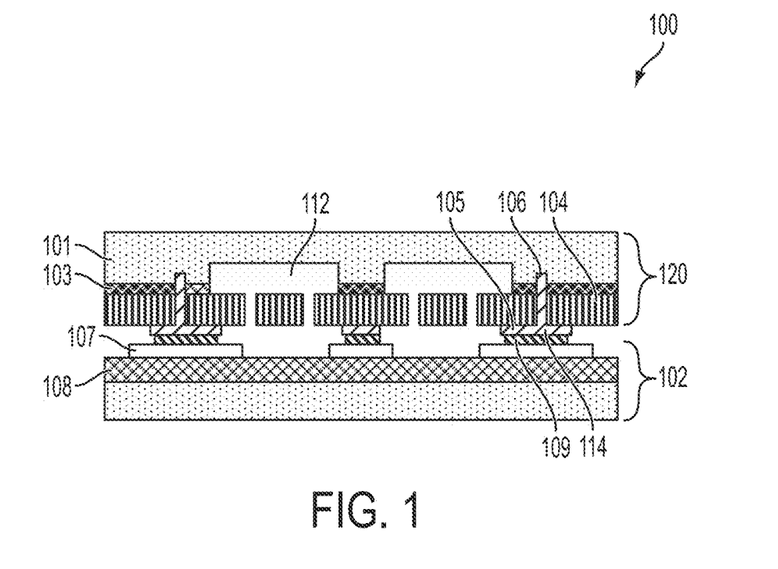
FIG. 1 is a diagram which illustrates a cross-section of the bonded MEMS-base substrate device with an internal direct electric coupling in accordance with a first embodiment.

FIG. 1 is a diagram which illustrates a cross-section of the bonded MEMS-base substrate device with an internal direct electric coupling in accordance with a first embodiment. An engineered silicon-on-insulator (ESOI) substrate 120 includes a handle layer 101 with cavities 112 and a device layer 104, fusion bonded together with a thin dielectric film 103 (such as silicon oxide) in between the device layer 104 and handle layer 101. An electrical connection between the handle layer 101 and the device layer 104 may be achieved by etching one or more vias 106 through the device layer 104 and the thin dielectric layer 103 into the handle layer 101 and by filling the vias 106 with a conductive material 114, such as polysilicon, tungsten, titanium, titanium nitride, aluminum, or germanium. The MEMS substrate is considered complete after a germanium (Ge) 109 and standoffs 105 comprising conductive material 114 are formed and MEMS actuator structures are patterned and etched in device layer 104. Alternately, the standoff can be formed from both the conductive material 114 and a portion of the device layer 104 by partially etching into the device layer during standoff formation.

The MEMS to a base substrate integration may be provided by eutectic bonding of germanium 109 of the MEMS substrate with aluminum 107 of a base substrate 102, where the AlGe bond provides the direct electrical coupling between MEMS substrate (handle 101 and device 104) and base substrate 102. In addition, AlGe bond provides hermetic vacuum seal of the MEMS device.

FIGS. 2A-2E are diagrams which illustrate a series of cross-sections illustrating processing steps to build the electric coupling from handle layer 101 to MEMS device layer 104 ready to bond to a base substrate 102 shown in FIG. 1.

Figure 2A:
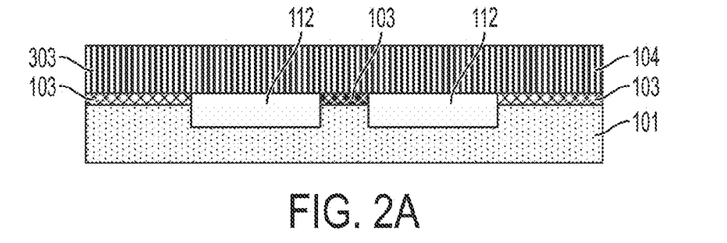
FIGS. 2A-2E are diagrams which illustrate a series of cross-sections illustrating processing steps to build the electric coupling from handle layer to MEMS device layer ready to bond to a base substrate for the device of FIG. 1.
Figure 2B:
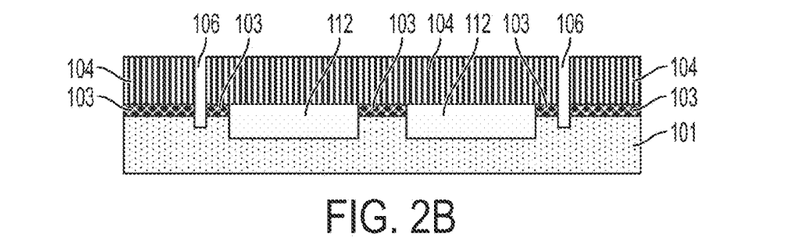
Figure 2C:
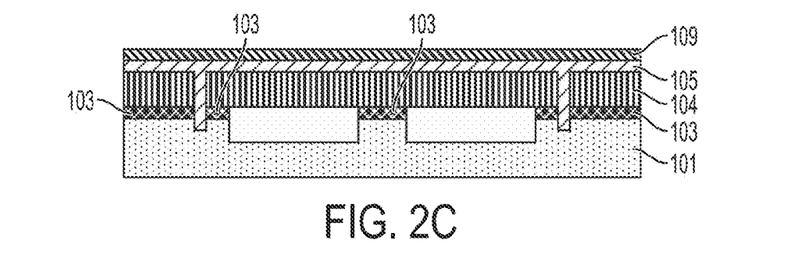
Figure 2D:
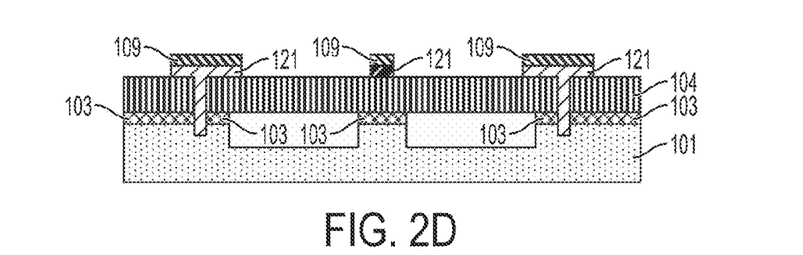
Figure 2E:
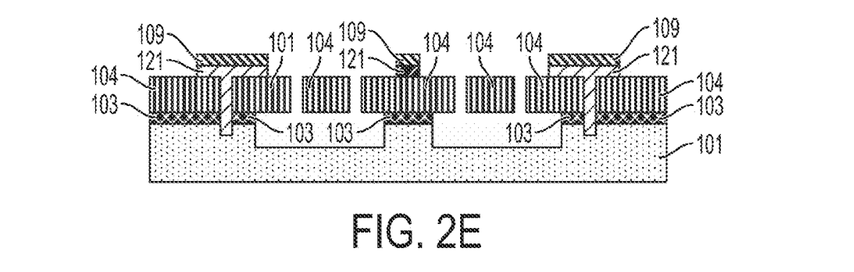

FIG. 2A is a diagram which illustrates the cross-section of an ESOI (engineered SOI) substrate with device layer 104 fusion-bonded to a handle silicon layer 101 with cavities 112. In an embodiment, as shown in FIG. 2B, vias 106 are patterned on device layer 104 of ESOI substrate and etched through device layer 104, through thin dielectric layer 103, and into handle layer 101. In another embodiment, vias 106 are patterned on device layer 104 of ESOI substrate and etched through device layer 104 and through thin dielectric layer 103 to expose a portion of the surface of handle layer 101. A conformal deposition of a conductive material 105 is then provided, as shown in FIG. 2O, to fill via 106 to establish electrical coupling between device layer 104 and handle layer 101. A germanium layer 109 is then deposited onto the conductive material 105. The next step shown in FIG. 2D is to pattern and etch conductive material 105 and germanium layer 109 to form standoffs 121 from the conductive material 105, followed by MEMS device layer 104 pattern and etch, as shown in FIG. 2E to complete the MEMS substrate processing, ready to bond to a base substrate. Alternately, the standoff 121 can be formed from both the conductive material 105 and a portion of the device layer 104 by partially etching into the device layer during standoff formation.

Figure 3:
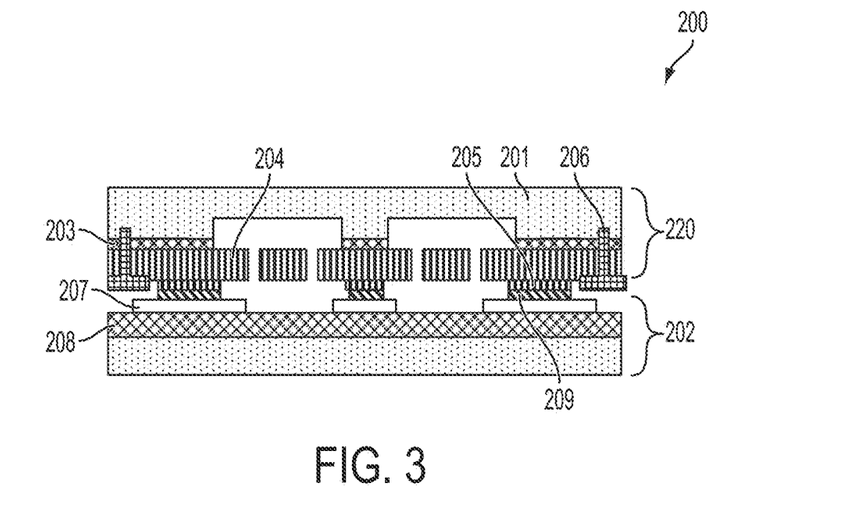
FIG. 3 is a diagram which illustrates a cross-section of the bonded MEMS-base substrate device with an internal direct electric coupling in accordance with a second embodiment.

FIG. 3 is a diagram which illustrates a cross-section of the bonded MEMS-base substrate device with an internal direct electric coupling in accordance with a second embodiment. In this embodiment, the electric coupling path is formed from handle layer 201 to MEMS device layer 204, across dielectric film 203, and eventually to base substrate Al pad 207 after MEMS to base substrate AlGe eutectic bonding.

An ESOI substrate 220 is comprised of a handle layer 201 with cavities 212 and a device layer 204, fusion bonded together with a thin dielectric layer 203 (such as silicon oxide) in between the device layer 204 and handle layer 201. The ESOI substrate is completed after device layer thinning. An electrical connection between handle layer 201 and device layer 204 can be achieved by etching at least one via 206 at any locations through device layer 204 and thin dielectric layer 203 into or exposing the surface of handle layer 201 and filling the via 206 by conductive materials, such as polysilicon, tungsten, titanium, titanium nitride, aluminum or germanium. In this embodiment, the remaining conductive materials on device layer 204 could be removed by thinning, polishing or etching-back to expose device layer for standoff formation 205. Steps of germanium deposition, standoff pattern, germanium etch, device layer 204 pattern, and etch, will be processed to complete the MEMS substrate.

The MEMS-base substrate integration is achieved by eutectic bonding of MEMS substrate with germanium pads 209 to base substrate with aluminum pads 207, where the AlGe bonding provides direct electrical coupling between MEMS substrate (handle 201 and device 204) and base substrate 202. In an embodiment, the standoff 205 forms a ring around the MEMS structure, the AlGe bond provides a hermetic seal for the MEMS structure. Via 206 can be positioned within or outside the seal ring formed by the standoff 205.

Figure 4:
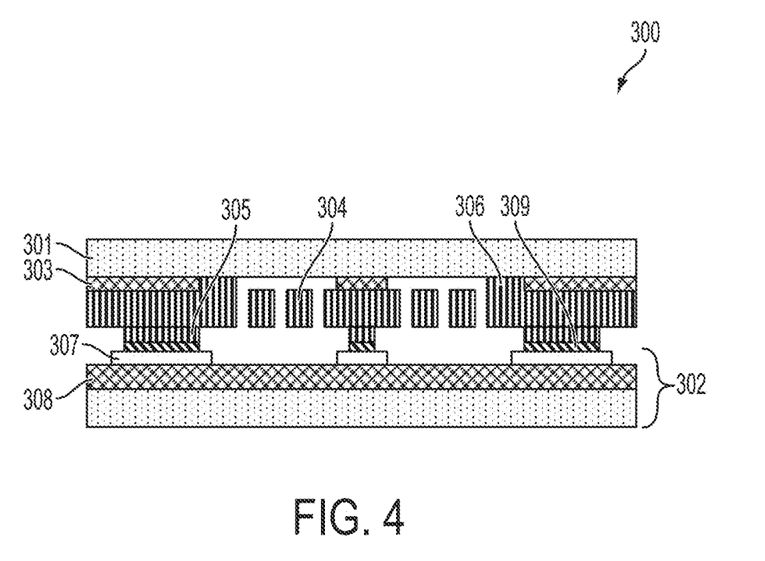
FIG. 4 is a diagram which illustrates a cross-section of the bonded MEMS-base substrate device with an internal direct electric coupling in accordance with a third embodiment.
Figure 5A:
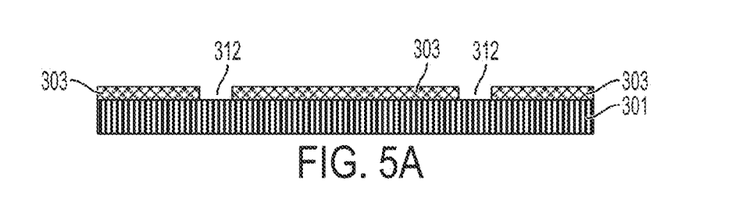
FIGS. 5A-5G are diagrams which illustrate a series of cross-sections illustrating processing steps to build the electric coupling from handle layer to MEMS device layer ready to bond to a base substrate for the device of FIG. 4.
Figure 5B:
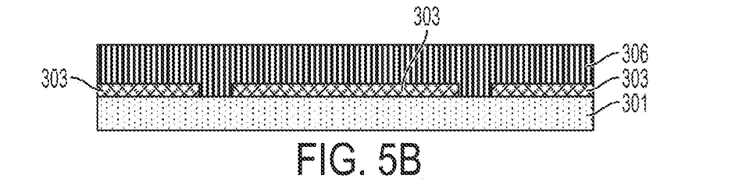
Figure 5C:
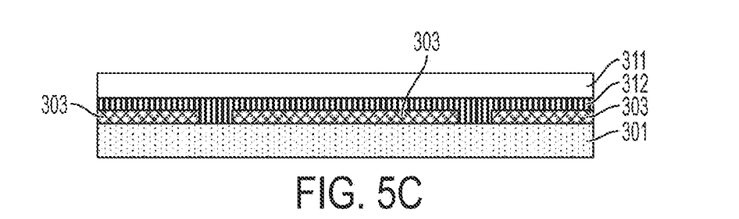

FIG. 4 is a diagram illustrating a third embodiment of the electric coupling between handle layer 301, MEMS device layer 304, and base substrate 302 using polysilicon for the device layer 304 and AlGe eutectic bonding. The process flow and fabrication method of MEMS substrate using a surface micro-machining process technique are illustrated in FIGS. 5A-5F. FIGS. 5A-5F are diagrams which illustrate a series of cross-sections illustrating processing steps to build the electric coupling from handle layer 301 to device layer 306 ready to bond to a base substrate 302 for the device of FIG. 4. Starting from FIG. 5A, a thin dielectric layer 303 (typically silicon oxide) is deposited on a handle layer 301. Thereafter the layer 303 is patterned and etched to form vias 312. A silicon layer 306 (FIG. 5B) is deposited onto the handle layer 301 followed by thinning and planarization, (for example grinding or chemical mechanical polishing) to desired device layer thickness. FIG. 5O illustrates an embodiment with a second thicker silicon device layer. In this embodiment, an additional silicon wafer 311 can be bonded to the thin polysilicon 312 and thinned down to desired device thickness. The bonding of the additional silicon wafer 311 overcomes thickness limitations from conventional deposition techniques.

Figure 5D:
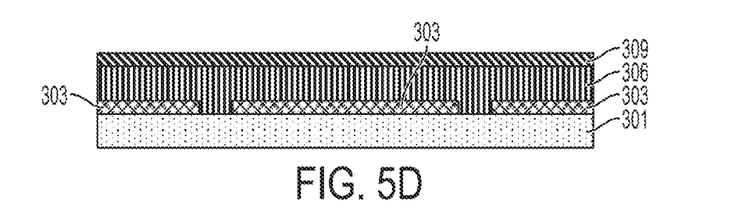
Figure 5E:
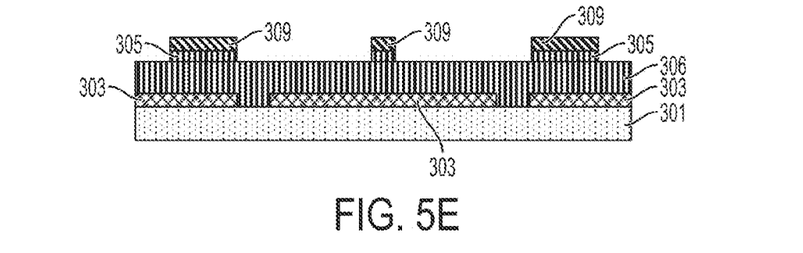
Figure 5F:
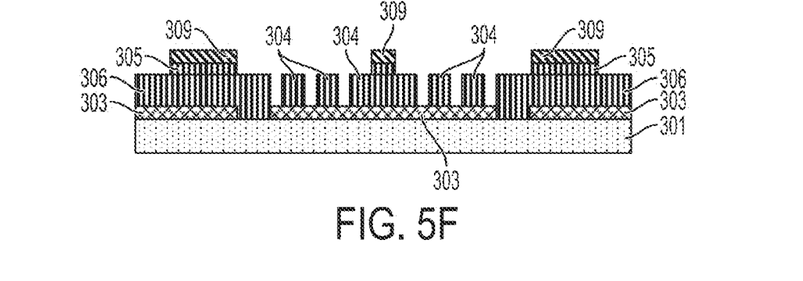
Figure 5G:
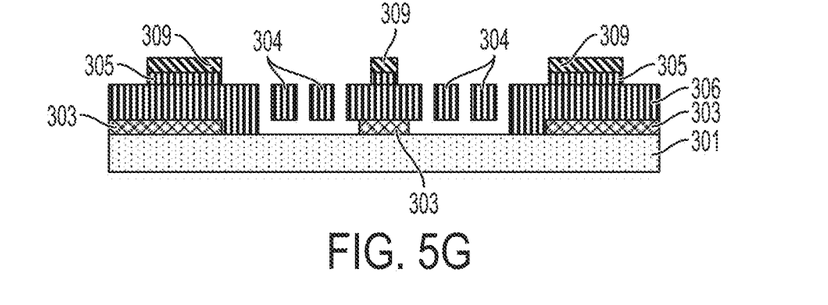

A Ge layer 309 is then deposited, as shown in FIG. 5D. FIG. 5E is a diagram which illustrates standoff 305 formation by patterning and etching into device layer 306. FIG. 5F is a diagram which illustrates patterning and etching silicon layer 306 to form MEMS structure 304. The patterning and etching step is followed by etching the silicon oxide to release the device layer 304 as shown in FIG. 5G. The MEMS substrate is now ready to be integrated with a base substrate.

As shown in FIG. 4, the MEMS-base substrate integration is achieved by eutectic bonding of MEMS substrate with germanium pads 309 to base substrate with aluminum pads 307, where the AlGe bonding provides direct electrical coupling between MEMS substrate (handle 301 and device 305) and base substrate 302. In addition, AlGe bonding provides hermetic vacuum seal of the MEMS device.

Figure 6A:
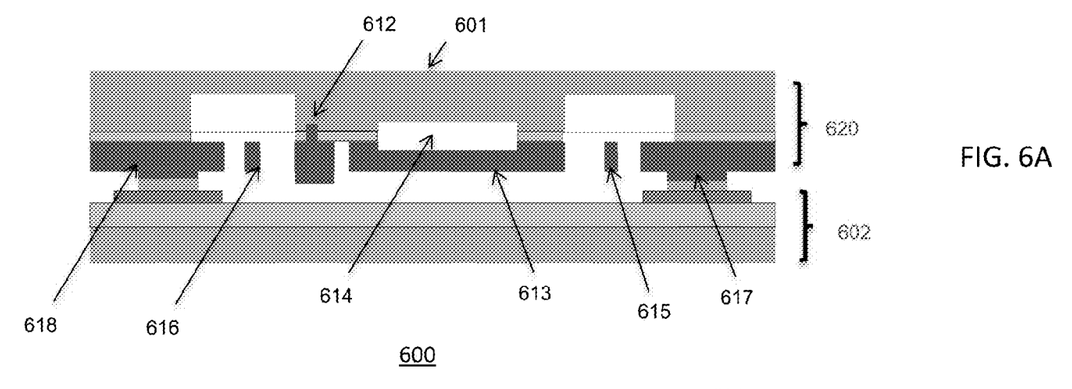
FIG. 6A is a diagram showing an embodiment of an unreleased pressure sensor.

In an embodiment it is desirable to utilize the system and method in accordance with the present invention as a pressure sensor. FIG. 6A is a diagram of an embodiment of an unreleased pressure sensor 600 including a MEMS substrate 620 with an enclosed sealed cavity 614 therein bonded to a CMOS wafer 602. 612 is the conductive via providing electrical connection from the first semiconductor layer 601 to CMOS wafer 602 through the device layer 618, the spring 616, standoff, germanium and Al pad. Layer 613 is connected to the CMOS wafer 602 through layer 617, spring 615, standoff, germanium and Al pad.

Figure 6B:
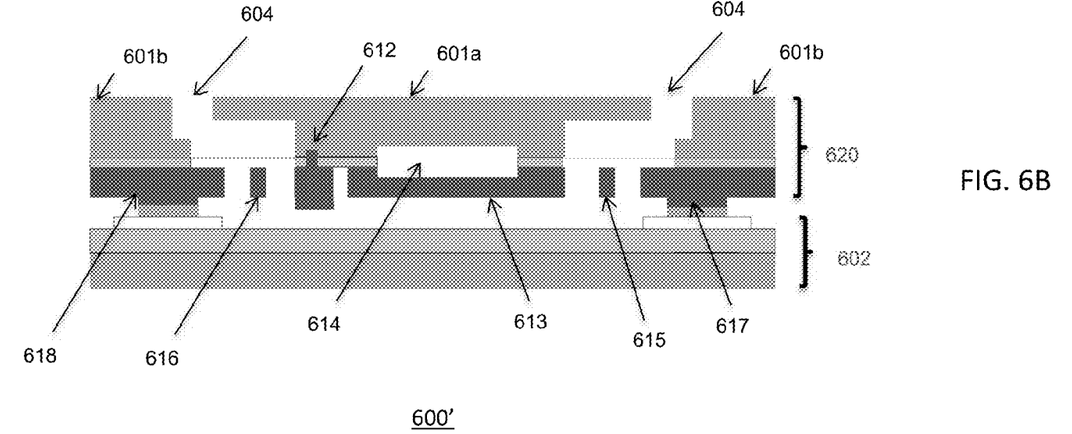
FIG. 6B is a diagram showing an embodiment of a released pressure sensor.

FIG. 6B is a diagram of an embodiment of a released pressure sensor 600' which is similar to FIG. 6A except that the MEMS handle layer is separated into a first portion 601a and second portions 601b using a etch to form openings 604. Openings 604 expose the underside of layer 613, spring 615 and spring 616 to the environment. The openings 604 electrically isolates portion 601a from portions 601b of the MEMS substrate 620. Cavity 614 remains sealed from the environment.

Under an increase in ambient environmental pressure the top side of portion 601a and the bottom side of layer 613 experiences forces that causes portion 601a and layer 613 to deflect towards each other decreasing the gap across cavity 614. To electrically measure the environmental pressure a gap dependent capacitor is formed across the cavity 614. The gap dependent capacitor is formed between portion 601a and layer 613. Portion 601a is electrically connected to the CMOS wafer 602 through standoff, germanium, Al pad, layer 618, spring 616 and through via 612. Layer 613 is electrically connected to the CMOS wafer 602 through standoff, germanium, Al pad, layer 617 and spring 615. Therefore the ambient pressure can be electrically measured at the CMOS wafer 602 by measuring the gap dependent capacitance formed across cavity 614.

Figure 7A:
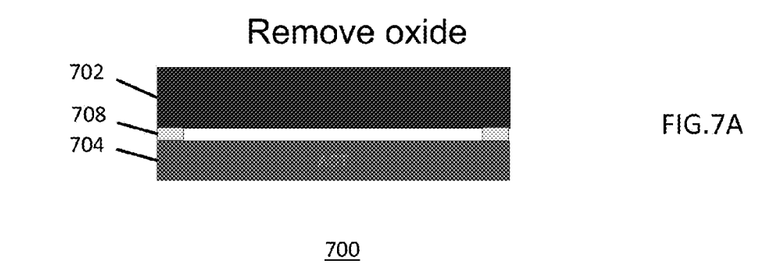
FIGS. 7A-7C illustrate different ways to define a gap within a pressure sensor.
Figure 7B:
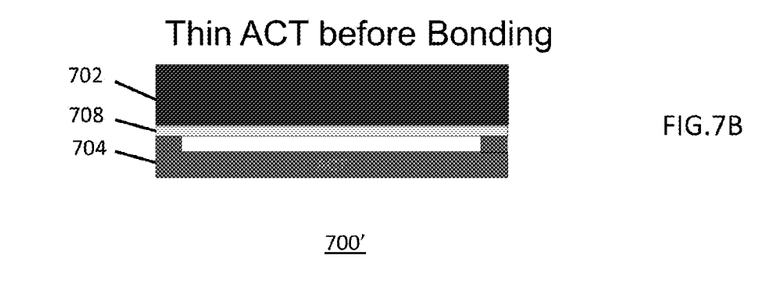
Figure 7C:
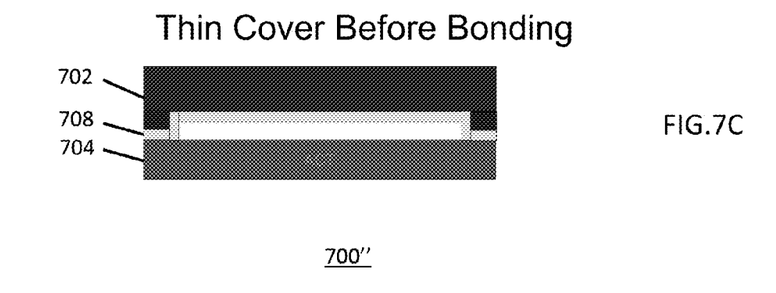

It is desirable in the devices 600 and 600' to define a gap within the enclosure cavity 614 to accurately and precisely sense pressure. FIGS. 7A-7C illustrate different ways to define a gap of the enclosure. Three layers form the substrate where the dielectric oxide layer 708 separates the handle layer 702 and the actuator layer 704. Each layer can be modified to form a cavity gap between the handle layer 702 and the actuator layer 704.

In FIG. 7A a portion of the oxide layer 708 is removed between the handle layer 702 and the actuator layer 704. In FIG. 7A the thickness of the remaining oxide layer defines the gap between the handle layer and the actuator layer. The actuator layer 704, oxide layer 708 and the handle layer 702 form the MEMS substrate 700.

In FIG. 7B, the actuator layer 704 is recessed before bonding. In FIG. 7B the recess in the actuator layer 704 defines the gap between the handle layer 702 and the actuator layer 704. The recessed actuator layer 704, oxide layer 708 and the handle layer 702 form the MEMS substrate 700'.

In FIG. 7C, the handle layer 702 is recessed before bonding. In FIG. 7C the recess in the handle layer 702 defines the gap between the handle layer 702 and the actuator layer 704. The recessed handle layer 702, oxide layer 708 and the handle layer 702 form the MEMS substrate 700'.

It is also desirable in the pressure sensors 600 and 600' to thin the diaphragm of the device to allow the thinned diaphragm to move accurately to measure pressure. FIGS. 8A-8D illustrate different ways to thin a diaphragm in a pressure sensor in accordance with an embodiment. Three layers form the cavity where the oxide layer separates the handle layer and the actuator layer. The handle layer or the actuator layer can be modified to become a thin diaphragm. The handle layer or the actuator layer can be thinned on either the bonding side before they are bonded together. Or the handle layer or actuator layer can be thinned from the non-bonding side before or after bonding. Since the capacitive gap is on the bonding side a partial etch is required when thinning from the bonding side so that remaining portion defines the capacitive gap.

Figure 8A:
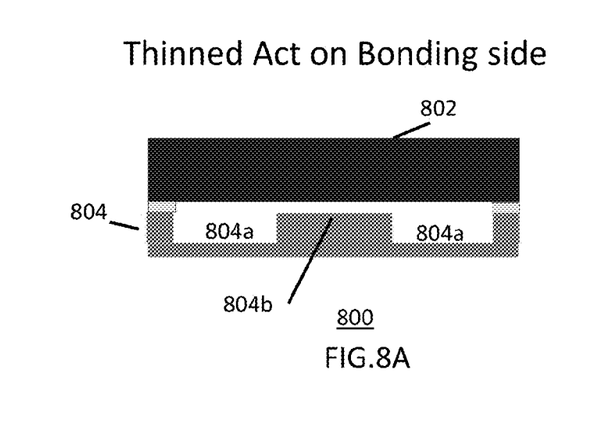
FIGS. 8A-8D illustrate different ways to thin a diaphragm in a pressure sensor.

In FIG. 8A, the actuator substrate 804 is thinned from the bonding side forming the diaphragm. The actuator substrate 804 is etched removing 804a and leaving portion 804b. Portion 804b forms a gap sensitive capacitor to layer 802. The actuator substrate 804 is bonded to the handle substrate 802 forming the MEMS substrate 800.

Figure 8B:
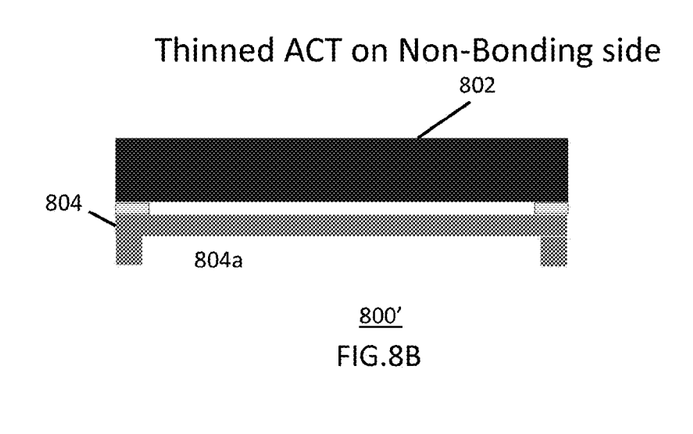

In FIG. 8B, the actuator substrate 804 is thinned from the non-bonding side forming the diaphragm. The actuator substrate 804 is thinned by removing portion 804a. Thinned actuator substrate 804 forms a gap sensitive capacitor to handle substrate 802. The actuator substrate 804 and the handle substrate 802 form the MEMS substrate 800'.

Figure 8C:
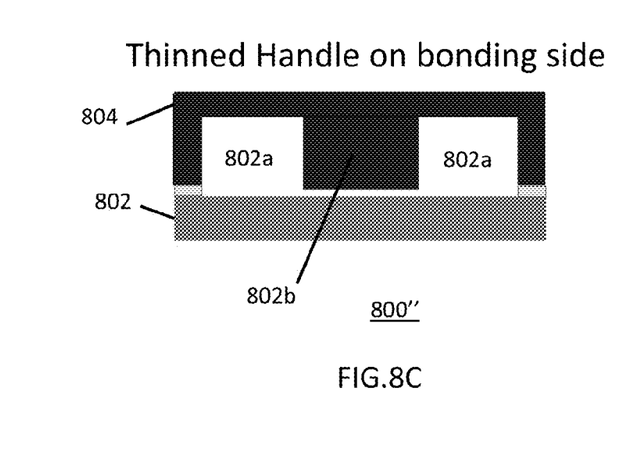

In FIG. 8C, the handle substrate 802 is thinned from the bonding side forming the diaphragm. The handle substrate 802 is etched removing 802a and leaving portion 802b. Portion 802b forms a gap sensitive capacitor to actuator substrate 804. The actuator substrate 804 is bonded to the handle substrate 802 forming the MEMS substrate 800''.

Figure 8D:
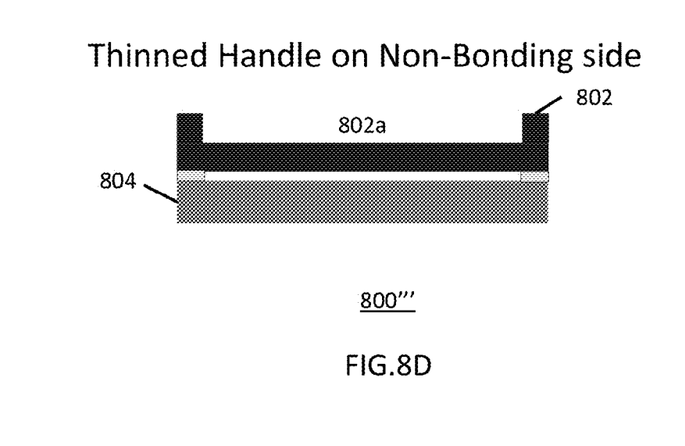

In FIG. 8D, the handle substrate 802 is thinned from the non-bonding side forming the diaphragm. The handle substrate 802 is thinned by removing portion 802a. Thinned handle substrate 802 forms a gap sensitive capacitor to actuator substrate 804. The handle substrate 804 and the handle substrate 802 form the MEMS substrate 800'''.

It is well understood by one of ordinary skill in the art that all of the techniques described in relation to all embodiments described herein can utilized to provide the pressure sensors 600 and 600' disclosed in FIGS. 6A and 6B.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A microelectromechanical system (MEMS) device comprising:
   a MEMS substrate comprising:
   a first semiconductor layer with a first portion and a second portion, a second semiconductor layer and a dielectric layer between the first semiconductor layer and the second semiconductor layer, wherein MEMS structures are formed from the second semiconductor layer, and wherein the MEMS structures comprise one or more first conductive pads;

a base substrate having one or more second conductive pads on the base substrate, wherein the one or more second conductive pads are connected to the one or more first conductive pads; and a conductive connector formed through the dielectric layer of the MEMS substrate to provide electrical coupling between the first semiconductor layer and the second semiconductor layer, wherein the base substrate is electrically connected to the second semiconductor layer and the first portion of the first semiconductor layer.

2. The MEMS device of claim 1, wherein the first portion and the second portion are electrically isolated from another.

3. The MEMS device of claim 1, wherein the first semiconductor layer has an opening to expose the MEMS structures to the environment.

4. The MEMS device of claim 1, further comprising electrodes on the MEMS structures, wherein the electrodes and the base substrate sense displacement of the MEMS structures.

5. The MEMS device of claim 1, wherein the MEMS device comprises a pressure sensor.

6. The MEMS device of claim 1, wherein the conductive connector comprises at least one of polysilicon, tungsten, titanium, titanium nitride, aluminum or germanium.

7. A method comprising:
providing a microelectromechanical system (MEMS) substrate, wherein the providing comprises:
forming one or more cavities in a first semiconductor layer;
forming a second semiconductor layer;
providing a dielectric layer between the first semiconductor layer and the second semiconductor layer;
bonding the first semiconductor layer to the second semiconductor layer;
etching at least one via through the second semiconductor layer and the dielectric layer;
depositing a first conductive material onto the second semiconductor layer and filling the at least one via;
depositing a second conductive material on the first conductive material;
patterning and etching the second conductive material and the first conductive material to form at least one stand-off;
defining one or more MEMS structures by patterning and etching the second semiconductor layer;
creating an opening to separate the first semiconductor layer into a first portion and a second portion, wherein the creating is performed by etching the first semiconductor layer; and
bonding the MEMS substrate to a base substrate using a eutectic bond between the second conductive material and metal pads of the base substrate.

8. The method of claim 7, wherein the bonding comprises fusion bonding.

9. The method of claim 7, wherein the second conductive material comprises germanium.

10. The method of claim 7, wherein the etching the at least one via further comprises partially etching into the first semiconductor layer.

11. The method of claim 9, wherein the metal pads comprise aluminum pads.

12. The method of claim 7, wherein the forming the standoff comprises partially etching into the second semiconductor layer.

13. The method of claim 7, wherein the first portion and the second portion are electrically isolated from one another.

14. The method of claim 7, wherein the opening exposes the one or more MEMS structures to the environment.

* * * * *